(12) United States Patent
Schaper

(10) Patent No.: US 7,984,754 B2
(45) Date of Patent: Jul. 26, 2011

(54) COOLING ELEMENT FOR HEAT DISSIPATION IN ELECTRONIC COMPONENTS

(75) Inventor: Elmar Schaper, Luegde (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 33 days.

(21) Appl. No.: 11/668,567

(22) Filed: Jan. 30, 2007

(65) Prior Publication Data
US 2007/0125517 A1 Jun. 7, 2007

Related U.S. Application Data

(63) Continuation of application No. 10/863,565, filed on Jun. 8, 2004, now Pat. No. 7,185,696.

(30) Foreign Application Priority Data

Jun. 12, 2003 (DE) .................. 103 26 458

(51) Int. Cl.
 *F28F 7/00* (2006.01)
 *H05K 7/20* (2006.01)
(52) U.S. Cl. ................ 165/185; 165/80.3
(58) Field of Classification Search ........... 165/80.3, 165/185, 104.33, 76, 78, 67–69; 174/16.3; 361/697, 704, 707, 709; 257/706–707, 718–719
See application file for complete search history.

(56) References Cited

U.S. PATENT DOCUMENTS

| | | | | |
|---|---|---|---|---|
| 2,861,782 A | * | 11/1958 | Swartz ............ | 165/80.3 |
| 4,233,645 A | * | 11/1980 | Balderes et al. ....... | 361/698 |
| 4,288,839 A | * | 9/1981 | Prager et al. ........ | 361/717 |
| 4,509,839 A | * | 4/1985 | Lavochkin ............ | 257/718 |
| 4,563,725 A | * | 1/1986 | Kirby ............... | 361/708 |
| 4,703,181 A | * | 10/1987 | Swann et al. ........ | 250/442.11 |
| 4,707,726 A | * | 11/1987 | Tinder ............. | 174/252 |
| 4,788,381 A | * | 11/1988 | Nilsson ............ | 174/368 |
| 4,933,746 A | * | 6/1990 | King .............. | 257/718 |
| 5,060,112 A | * | 10/1991 | Cocconi ............ | 361/719 |
| 5,241,453 A | * | 8/1993 | Bright et al. ........ | 361/704 |
| 5,402,313 A | * | 3/1995 | Casperson et al. ..... | 361/710 |
| 5,411,348 A | * | 5/1995 | Balsells ............ | 403/326 |
| 5,466,970 A | * | 11/1995 | Smithers ........... | 257/712 |
| 5,640,304 A | | 6/1997 | Hellinga et al. | |
| 5,926,369 A | * | 7/1999 | Ingraham et al. ...... | 361/699 |

(Continued)

FOREIGN PATENT DOCUMENTS

| | | |
|---|---|---|
| DE | 3803469 | 8/1989 |
| DE | 29612437 | 10/1996 |
| DE | 19538642 | 4/1997 |
| DE | 19729851 | 1/1999 |
| GB | 2153152 A | 8/1985 |

(Continued)

*Primary Examiner* — Tho v Duong
(74) *Attorney, Agent, or Firm* — Leydig, Voit & Mayer, Ltd.

(57) ABSTRACT

A cooling element for electronic or electromechanical components includes a metal element defining a receiving space and a receiving groove associated with the receiving space. The receiving space has an inner wall and is configured to receive an electronic or electromechanical component by an insertion of the electronic or electromechanical component in an insertion direction. The receiving groove has a longitudinal axis lying transverse to the insertion direction. An elongated spring is disposed in the receiving groove so that a longitudinal axis of the spring lies parallel to the longitudinal axis of the receiving groove and so that the spring is deformed by the insertion of the electronic or electromechanical component. A return force of the spring urges the inserted electronic or electromechanical component against an inner wall of the receiving space in a direction transverse to the longitudinal axis of the spring.

18 Claims, 4 Drawing Sheets

U.S. PATENT DOCUMENTS

| | | | | |
|---|---|---|---|---|
| 5,991,151 A | * | 11/1999 | Capriz | 361/704 |
| 6,225,559 B1 | | 5/2001 | Hubner et al. | |
| 6,771,504 B2 | * | 8/2004 | Barcley | 361/704 |
| 6,791,183 B2 | * | 9/2004 | Kanelis | 257/718 |
| 2001/0030037 A1 | * | 10/2001 | Hellbruck et al. | 165/80.3 |
| 2001/0042638 A1 | * | 11/2001 | Yamada et al. | 174/260 |

FOREIGN PATENT DOCUMENTS

| | | | |
|---|---|---|---|
| JP | 62252158 A | | 11/1987 |
| JP | 6061668 A | | 3/1994 |
| JP | 09232487 A | * | 9/1997 |
| JP | 10107467 A | | 4/1998 |

\* cited by examiner

COOLING ELEMENT FOR HEAT DISSIPATION IN ELECTRONIC COMPONENTS

This is a continuation of application Ser. No. 10/863,565, filed Jun. 8, 2004, now issued as U.S. Pat. No. 7,185,696, which application claims priority to German patent application DE 103 26 458.2, filed Jun. 12, 2003, the subject matters of both applications of which are hereby incorporated by reference herein.

The invention relates to a cooling element for heat dissipation in one or more electronic components, consisting of a heat-dissipating metal element and a spring that serve to press the electronic component against the metal element.

BACKGROUND

German utility model DE 296 12 437 U1 describes a cooling element for an electronic component, consisting of a metal element and of a passage opening to receive the electronic component. Through the insertion of a leaf spring, the electronic component is brought into thermal contact with a wall of the metal element. The drawback here is that, in an additional assembly step, the spring has to be subsequently inserted into the opening that receives the electronic component.

German patent application DE 197 29 851 A1 describes a cooling element consisting of a metal element in which the thermal contact with the electronic component is achieved by means of a leaf spring. This leaf spring, however, functions like a clamping spring and it pulls the electronic component towards the outer wall of the metal element. The assembly of such a cooling element is impractical when conventional electronics housings are used since the electronic component to be cooled has to project out of the electronics housing in order to be brought into thermal contact with the cooling element.

SUMMARY

An aspect of the present invention is to provide a cooling element for one or more electronic components arranged next to or behind each other, including a heat-dissipating metal element and at least one pressure means whereby, in a simple manner, one or more electronic components to be cooled are brought into thermal contact with the cooling element.

In an embodiment, the present invention provides a cooling element for one or more electronic or electromechanical components. The cooling element includes a metal element defining a receiving space and a receiving groove associated with the receiving space. The receiving space has an inner wall and is configured to receive an electronic or electromechanical component by an insertion of the electronic or electromechanical component in an insertion direction. The receiving groove has a longitudinal axis lying transverse to the insertion direction. An elongated spring is disposed in the receiving groove so that a longitudinal axis of the spring lies parallel to the longitudinal axis of the receiving groove and so that the spring is deformed by the insertion of the electronic or electromechanical component. A return force of the spring urges the inserted electronic or electromechanical component against an inner wall of the receiving space in a direction transverse to the longitudinal axis of the spring.

BRIEF DESCRIPTION OF THE DRAWINGS

The invention will be described below based on exemplary embodiments with reference to the drawings, in which.

DETAILED DESCRIPTION

Figure 1:
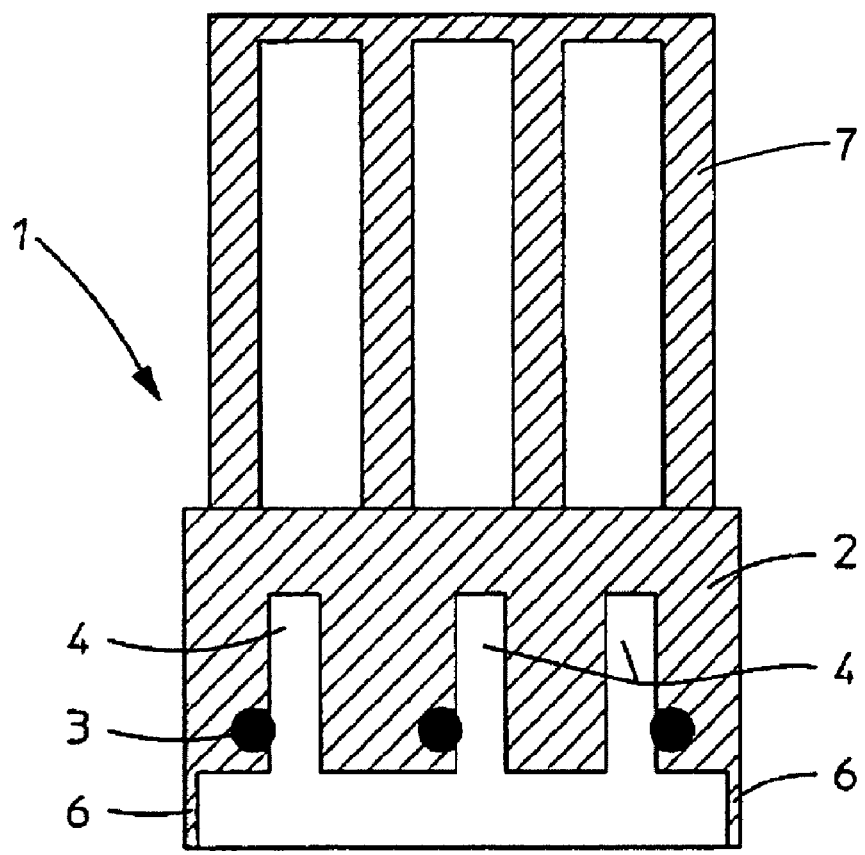
FIG. 1 shows a cooling element in a front sectional view.
Figure 1:
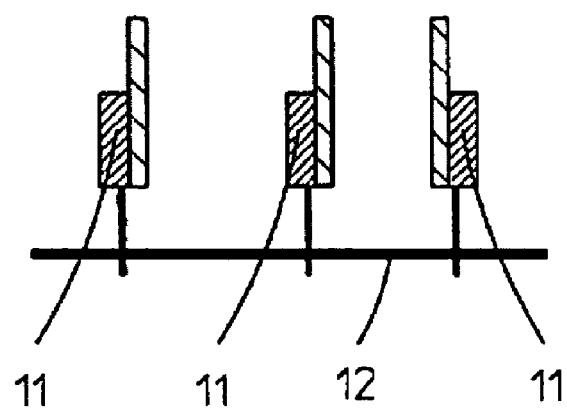

The present invention provides a cooling element for one or more electronic components. The cooling element includes a metal element defining a receiving opening configured to receive electronic component and defining a receiving bore associated with the receiving opening; and a spring disposed in the receiving bore so as to urge the electronic component against an inner wall of the receiving opening.

The present invention also provides a method for establishing thermal contact between one or more electronic components and a cooling element for heat dissipation. The method includes disposing a spring in a receiving bore of the metal element; and inserting an electronic component into a receiving opening of the metal element so that the electronic component is urged against an inner wall of the receiving opening by a radial return force of the spring.

The metal element of the cooling element has one or more slit-shaped receiving openings for one or more electronic components that are to be cooled in each receiving opening. In its lengthwise extension, each receiving opening has a receiving bore that holds a helical spring and that runs parallel to the lengthwise extension. The receiving bore is arranged in such a way that it is open on the lengthwise side towards the receiving opening. The receiving bore is arranged in such a way that the lateral opening faces in the direction of the electronic component. A helical spring is placed into the receiving bore and a radial partial section of said spring projects into the opening for receiving the electronic component. When the electronic component is inserted into the receiving opening in the cooling element, the radial return force of the helical spring presses the electronic component against the opposite inner wall of the receiving opening. Advantageously, several electronic components next to each other in the receiving opening can be simultaneously brought into thermal contact with the cooling element. This is the case, for instance, when the cooling element is mounted on a printed circuit board in which the electronic components to be cooled are positioned in such a way that they match the receiving openings and can thus be inserted simultaneously into the receiving openings. The helical spring is essentially only deformed where the electronic component is pressed against the cooling element, so that a virtually uniform pressing force is ensured for each electronic component. In another embodiment, for purposes of pressing the electronic component against the cooling element, springs that have a tubular, radial action, or else permanently flexible plastic cylinders or rubber cylinders can be used.

In an embodiment of the cooling element, several receiving openings with the appertaining receiving bores can be provided.

The metal element is preferably made of extruded metal since the receiving openings for one or more electronic components can be designed as a continuous shaft in the lengthwise direction. The receiving bore for the cylindrical spring runs in the axial direction parallel to the continuous shaft that runs in the longitudinal direction for the opening for receiving one or more electronic components. Another advantage of the invention is that the length and height of the receiving opening can be dimensioned in such a way that electronic components of different sizes can be inserted into the receiving opening. Another advantage of the cooling element according to the invention is that several electronic components to be cooled are inserted simultaneously into one or more receiving openings. In this context, the spring(s) is/are preferably placed or slid into the receiving bore(s) prior to the insertion of the electronic components to be cooled.

In an embodiment, two opposite extensions of the metal element form side walls on the side of the component insertion guide of the cooling element, as a result of which these side walls serve as spacers relative to a printed circuit board.

The cooling element according to the invention is not limited to heat dissipation for electronic components since other applications such as heat dissipation for electromechanical components such as, for example, relays or solenoid valves, are also included.

Figure 2:
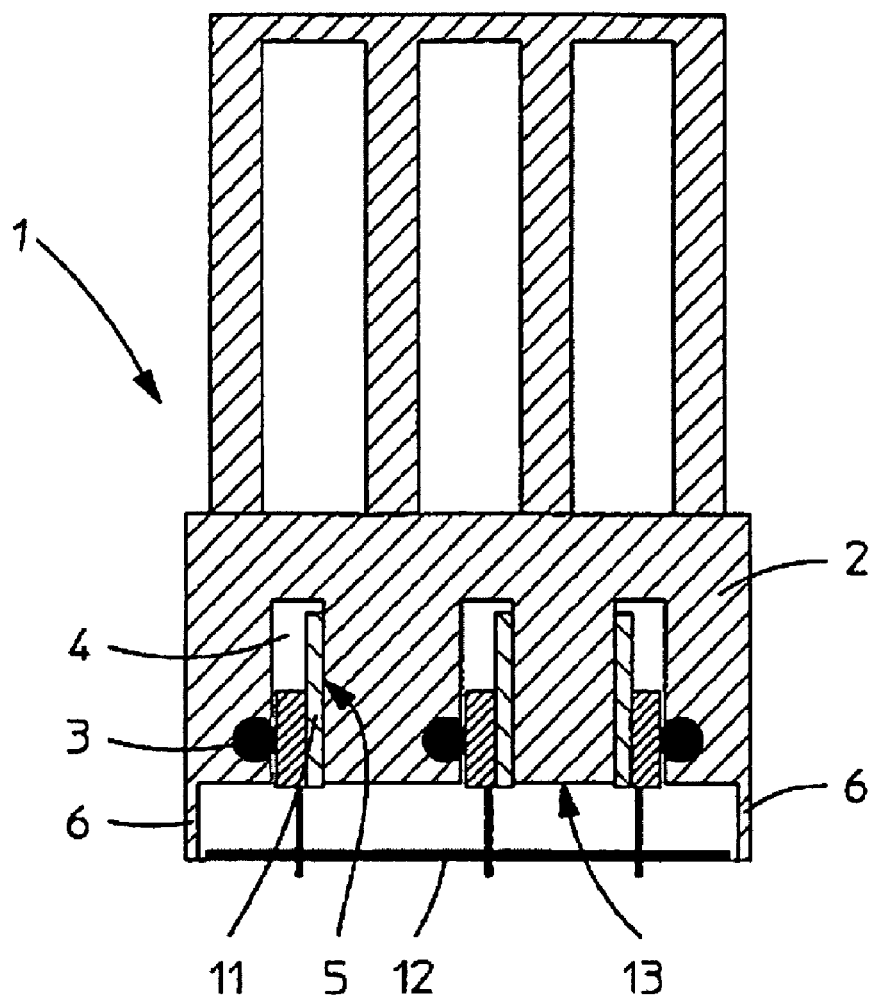
FIG. 2 shows a cooling element in conjunction with thermally contacted electronic components.
Figure 3A:
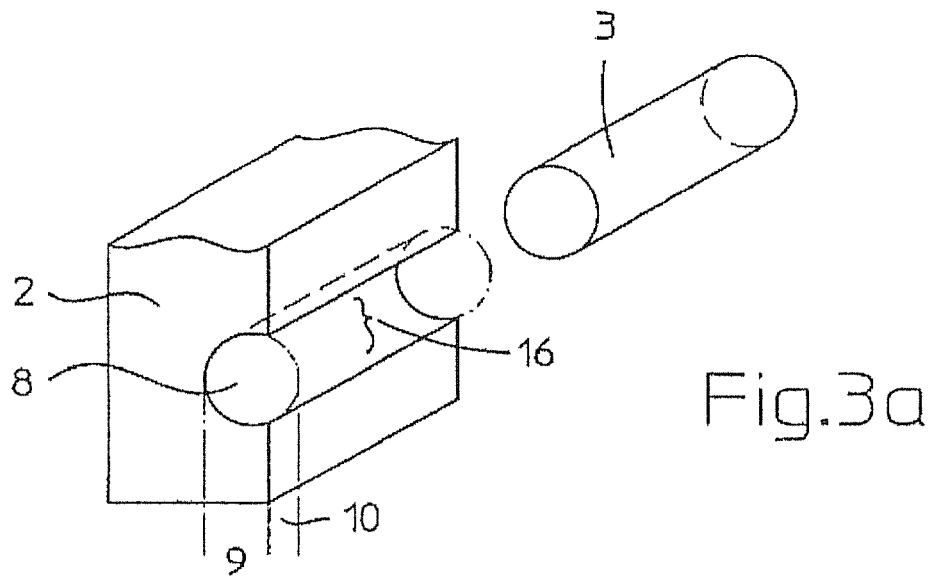
FIG. 3a shows a detailed view of the area of a receiving bore for a spring.

FIG. 1 depicts the cooling element 1 according to the invention in a front sectional view. In addition to its cooling fins 7, the metal element 2 also has receiving openings 4 running in the longitudinal direction for receiving one or more electronic components 11. A receiving bore running parallel to the receiving opening 4 holds the helical spring 3 in a spring space. As shown in FIG. 2, the electronic component 11 is pressed against the inner wall 5 of the receiving opening 4 and thus brought into thermal contact with the metal element 2. The spring 3, which is cylindrical in shape, presses from the side located opposite from the inner wall 5 against the electronic component 11. The side walls 6 partially enclose the printed circuit board 12 on one or two sides, thus ensuring that the printed circuit board 12 remains at a distance from the bottom 13 of the cooling element 1. FIG. 3a shows a detailed and perspective view of the area of the spring space 8 for the spring 3 partially formed by a receiving bore. Here, the spring space 8 is in a first radial partial section 9 in the metal element 2 and in a second radial partial section 10 in the receiving opening 4 for the electronic component 12. The first radial partial section 9 is designed to be larger than the second radial partial section 10, as a result of which the lateral opening 16 thus formed is narrower than the diameter of the spring space 8. This dimensioning prevents the spring 3 from falling out of the spring space 8 that holds the spring into the receiving opening 4 that holds at least one electronic component 11.

Figure 3B:
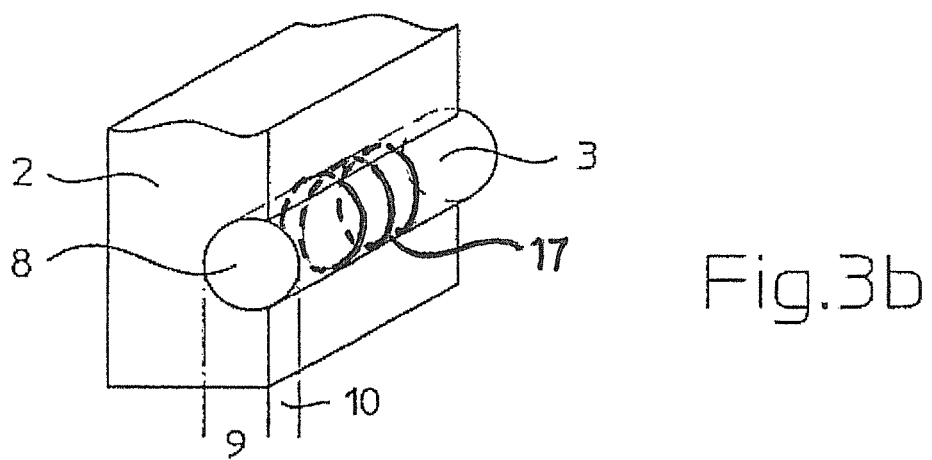
FIG. 3b shows a detailed view of an area of a receiving bore with a spring inserted into the receiving bore.
Figure 3C:
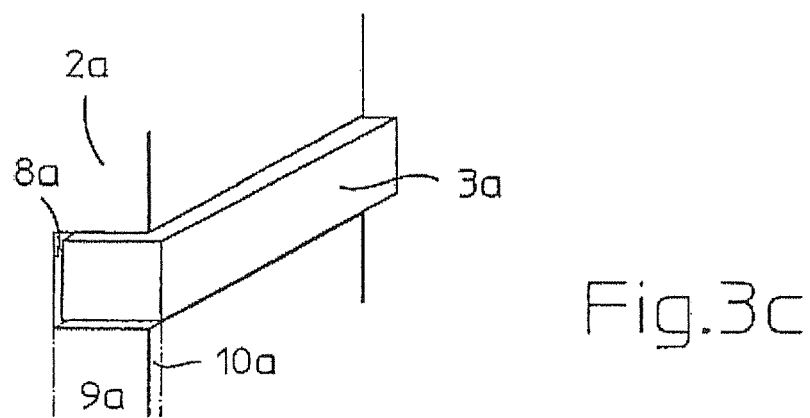
FIG. 3c shows a detailed view of an area of a receiving bore having a rectangular shape and with a spring inserted into the receiving bore.

FIG. 3b shows a detailed and perspective view of the area of the spring space 8 for the spring 3, whereby here, the spring 3, which is in the form of a helical spring 17, has been inserted into the spring space 8. Here, it can be clearly seen that the spring 3 extends by the second partial section 10 into the receiving opening 4 for the electronic component 11. Different types are conceivable for the spring 3. Aside from a generally known coil spring—which in this embodiment, however, acts in the radial direction instead of in the axial direction—springs that have a tubular, axial action, or else solid, permanently flexible plastic cylinders or rubber cylinders are likewise conceivable. FIG. 3c shows by way of an example the spring space 8a in a rectangular shape, whereby the spring 3a inserted into it lies in a partial section 9a in the metal element 2a, and projects in a partial section 10a into the receiving opening 4 that holds at least one electronic component 11.

Figure 4A:
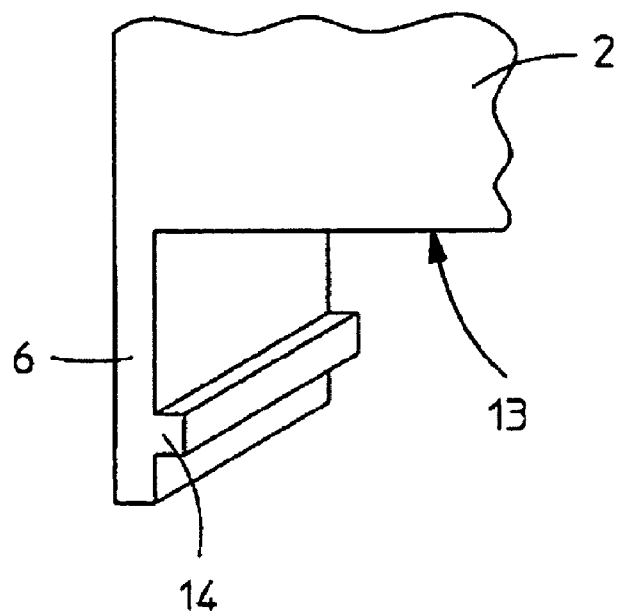
FIGS. 4a, 4b show a detailed view of side walls.
Figure 4B:
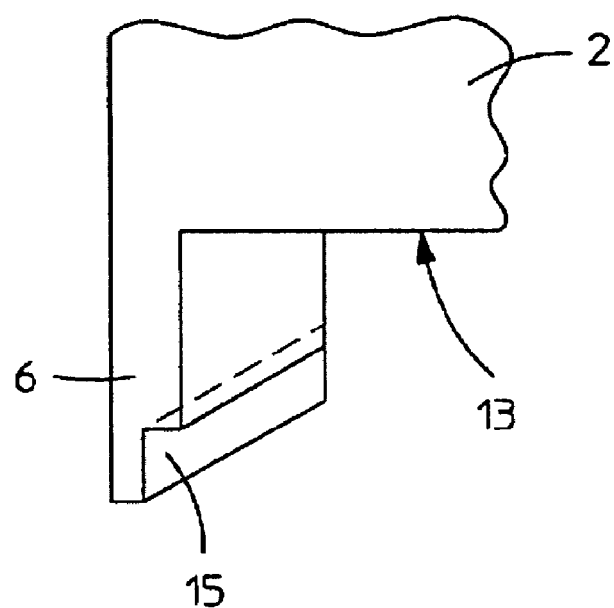

FIG. 4a shows a preferred embodiment with the side wall 6 that is shaped onto the bottom 13 of the metal element 2. In an embodiment, there is a ridge 14 shaped onto the inside of the side walls 6 for purposes of guiding or positioning a printed circuit board 12 towards the metal element 2. FIG. 4b shows another preferred embodiment with the above-mentioned side wall 6 which, in order to guide or position a printed circuit board 12 towards the metal element 2, has at least one step 15 shaped onto the inside of the side walls 6.

List of Reference Numerals
1 cooling element
2 metal element
3 spring
4 receiving opening for an electronic component
5 inner wall
6 side wall
7 cooling fins
8 spring space for a spring
9 first radial partial section of the spring space
10 second radial partial section of the spring space
11 electronic component
12 printed circuit board
13 bottom of the cooling element
14 ridge
15 step
16 lateral opening
17 helical spring

What is claimed is:

1. A cooling element for one or more electronic or electromechanical components, the cooling element comprising:
   a metal element defining a receiving space having a first and a second inner wall, the receiving space being configured to receive an electronic or electromechanical component by an insertion of the electronic or electromechanical component in an insertion direction;
   a receiving groove defined by the metal element and disposed in the first inner wall of the receiving space, the receiving groove having a longitudinal axis lying transverse to the insertion direction and a lateral opening having a first opening width in the insertion direction, the first opening width of the lateral opening being narrower than a diameter of the receiving groove; and
   an elongated cylindrical spring disposed in the receiving groove so that a longitudinal axis of the spring lies parallel to the longitudinal axis of the receiving groove, the spring being sized such that the spring is held in the receiving groove and is hindered from entirely passing through the lateral opening, the spring being deformed by the insertion of the electronic or electromechanical component, a return force of the spring urging the inserted electronic or electromechanical component against the second inner wall of the receiving space in a direction transverse to the longitudinal axis of the spring.

2. The cooling element as recited in claim 1 wherein the spring projects into the receiving space from a side of the receiving space opposite the second inner wall.

3. The cooling element as recited in claim 1 wherein:
   the return force of the spring urges the electronic or electromechanical component against the second inner wall so as to establish a thermal contact between the electronic or electromechanical component and the inner wall.

4. The cooling element as recited in claim 3 wherein the spring projects into the receiving space from a side of the receiving space opposite the second inner wall.

5. The cooling element as recited in claim 1 wherein the metal element includes an extruded profile.

6. The cooling element as recited in claim 1 wherein the spring includes a helical spring.

7. The cooling element as recited in claim 1 wherein the spring includes a tubular shape and the return force is a radial return force.

8. The cooling element as recited in claim 1 wherein the metal element includes a side wall configured to enclose a side of a printed circuit board.

9. The cooling element as recited in claim 8 wherein the side wall includes a ridge or step configured to physically delimit the printed circuit board.

10. The cooling element as recited in claim 1 wherein the receiving groove has a circular cross-section.

11. A cooling element for one or more electronic or electromechanical components, the cooling element comprising:
 a metal element defining a receiving space configured to receive an electronic or electromechanical component by an insertion of the electronic or electromechanical component in an insertion direction, the receiving space including a first inner wall and a second inner wall, each of the first and second inner walls having a first end adjacent an opening of the receiving space and a second end opposite the first end, the first inner wall having first and second planar surfaces parallel to the insertion direction and coplanar with respect to one other, the second inner wall having a planar surface parallel to the insertion direction;
 a receiving groove disposed in the first inner wall of the receiving space, the receiving groove having a longitudinal axis lying transverse to the insertion direction and a lateral opening defined by a first edge and a second edge, the first planar surface of the first inner wall extending from the first edge of the receiving groove to the first end of the first inner wall, and the second planar surface of the first inner wall extending from the second edge of the lateral opening to the second end of the first inner wall; and
 an elongated spring disposed in the receiving groove so that a longitudinal axis of the spring lies parallel to the longitudinal axis of the receiving groove and the spring having a portion extending from the receiving groove into the receiving space along an entire length of the spring so that the spring is deformed by the insertion of the electronic or electromechanical component, a return force of the spring urging the inserted electronic or electromechanical component against the second inner wall of the receiving space in a direction transverse to the longitudinal axis of the spring.

12. The cooling element as recited in claim 11 wherein the spring protrudes from the first inner wall into the receiving space.

13. The cooling element as recited in claim 11 wherein:
 the receiving groove includes a rectangular or trapezoidal shape and defines a portion of a spring space in which the spring is received, the spring space including a first partial section in the metal element and a second partial section in the receiving space configured so that the spring projects into the receiving space; and
 the return force of the spring urges the electronic or electromechanical component against the second inner wall so as to establish a thermal contact between the electronic or electromechanical component and the second inner wall.

14. The cooling element as recited in claim 11 wherein the spring includes a helical spring.

15. The cooling element as recited in claim 11 wherein the spring includes a tubular shape and has a radial action.

16. The cooling element as recited in claim 11 wherein the metal element includes at least one side wall including a ridge or step configured to physically delimit a printed circuit board.

17. The cooling element as recited in claim 11 wherein the receiving groove has a circular cross-section.

18. The cooling element as recited in claim 11 wherein the receiving groove has a rectangular cross-section.

* * * * *